United States Patent [19]

Lau et al.

[11] Patent Number: 5,158,900
[45] Date of Patent: Oct. 27, 1992

[54] METHOD OF SEPARATELY FABRICATING A BASE/EMITTER STRUCTURE OF A BICMOS DEVICE

[75] Inventors: Chi-Kwan Lau, Saratoga; Donald L. Packwood, San Jose; Chen-Hsi Lin, Cupertino; Ashor Kapoor, Palo Alto, all of Calif.

[73] Assignee: Hewlett-Packard Company, Palo Alto, Calif.

[21] Appl. No.: 779,448

[22] Filed: Oct. 18, 1991

[51] Int. Cl.$^5$ .......................................... H01L 21/265
[52] U.S. Cl. ........................................ 437/31; 437/34; 437/41; 437/56
[58] Field of Search ................ 437/31, 34, 41, 57, 437/56, 162, 43; 148/DIG. 9

[56] References Cited

U.S. PATENT DOCUMENTS

| | | | |
|---|---|---|---|
| 4,727,046 | 2/1988 | Tuntasood et al. | 437/54 |
| 4,774,204 | 9/1988 | Havemann | 437/54 |
| 4,803,175 | 2/1989 | Alvarez et al. | 437/31 |
| 4,902,639 | 2/1990 | Ford | 437/56 |
| 4,914,048 | 4/1990 | Scovell et al. | 437/33 |
| 4,927,776 | 5/1990 | Soejima | 437/31 |
| 4,962,053 | 10/1990 | Spratt et al. | 437/31 |
| 4,983,531 | 1/1991 | Cosentino | 437/31 |
| 4,988,633 | 1/1991 | Josquin | 437/31 |

Primary Examiner—Brian E. Hearn
Assistant Examiner—Kevin M. Picardat

[57] ABSTRACT

A method of fabricating a BiCMOS device in which PMOS and NMOS transistors are formed prior to a base/emitter structure of a bipolar transistor. In forming the base/emitter structure, a blanket implant of a first impurity is introduced into a base region of a semiconductor substrate. An insulating layer is deposited and then patterned to expose a portion of the base region at an emitter window. A polysilicon layer is deposited on the insulating layer and into the emitter window. The polysilicon layer is patterned to provide the desired configuration at the emitter window, whereafter the remaining polysilicon acts as a mask for etching of the insulating layer. Thus, etching of the insulating layer is performed in a self-aligning manner. Self-alignment is also utilized in providing a base-link region and in providing a silicide layer.

14 Claims, 4 Drawing Sheets

METHOD OF SEPARATELY FABRICATING A BASE/EMITTER STRUCTURE OF A BICMOS DEVICE

DESCRIPTION

1. Technical Field

The present invention relates generally to the fabrication of semiconductor devices and more particularly to methods of fabricating a BiCMOS device.

2. Background Art

The integration of complementary oxide semiconductor (CMOS) transistors and bipolar transistors provides integrated circuits having greater density and higher switching speeds. However, because of the differences in bipolar and CMOS technologies integration typically involves compromises. The resulting BiCMOS device does not optimize either CMOS or bipolar characteristics.

The trend is to simultaneously fabricate the CMOS transistors and the bipolar transistors. An integration of the fabrication steps is taught in U.S. Pat. No. 4,774,204 to Havemann. The Havemann patent teaches that simultaneous fabrication reduces the number of thermal cycles that are required in forming a BiCMOS device. U.S. Pat. No. 4,914,048 to Scovell et al. also teaches simultaneous fabrication of CMOS and bipolar transistors.

Simultaneous fabrication only increases the likelihood that compromises will be made during formation of the BiCMOS devices. The device of Scovell et al. includes oxide regions below the gates of the CMOS transistors and below a portion of the emitter of the bipolar transistor. Because the same material is used in the formation of each of the oxide regions, the oxide regions have the same thickness. This may not be preferred, since the characteristics of bipolar emitters are not identical to the characteristics of CMOS gates.

Another concern in BiCMOS processing is increasing manufacturing yields. Integrating bipolar transistors with CMOS transistors on a single substrate necessarily adds processing steps. As taught in U.S. Pat. No. 4,727,046 to Tuntasood et al., the integration of the two transistor fabrication technologies often results in a lengthy and complicated process which uses a large number of masking operations and which is vulnerable to lower yields as a result of the complexity. The Scovell et al. patent teaches a method of fabricating a BiCMOS device in which only two masking steps are added to the conventional CMOS processing. However, reducing the fabrication process to two additional masking steps is possible only if the CMOS and bipolar transistors are simultaneously fabricated. More than two masking steps are required if the conventional CMOS masking steps are not utilized in forming the bipolar transistor. Thus, it is difficult to optimize the electrical characteristics of both the CMOS and bipolar transistors.

It is an object of the present invention to provide a method of fabricating a base/emitter structure of a bipolar transistor for a BiCMOS device, wherein the method does not add significantly to the complexity of conventional CMOS fabrication process and wherein the electrical characteristics of both types of transistors can be optimized.

SUMMARY OF THE INVENTION

The above object has been met by a method of fabricating a base/emitter structure in a bipolar device which utilizes self-aligning techniques and which allows formation of the structure after formation of the CMOS transistors, but without significantly affecting fabrication complexity. The method is contrary to the trend to simultaneously fabricate the bipolar and CMOS transistors. The separate fabrication improves the electrical characteristics of both types of transistors.

The method includes isolating regions of a semiconductor substrate to provide PMOS, NMOS and bipolar base regions. The PMOS and NMOS transistors are then formed utilizing conventional techniques. A blanket implant of a first impurity is provided across the PMOS, NMOS and bipolar base regions at a doping intensity to form the base of the bipolar transistor, but not to adversely affect the electrical characteristics of the CMOS transistors.

A low-temperature oxide is deposited across the surface of the semiconductor substrate. A window is formed in the oxide layer to expose a portion of the base region. An emitter layer is then deposited on the oxide layer and into the window. A second impurity is implanted into the emitter layer.

A layer of photoresist is deposited to cover the emitter layer. The second, and last, masking step is utilized in patterning the photoresist. Following patterning of the photoresist, the emitter layer is etched to leave a desired pattern of emitter material. In a self-aligning manner, the desired pattern of emitter material is used as a mask during etching of the oxide layer.

Again using self-aligning techniques, the emitter material and the remaining oxide act as a mask during a blanket base-link implant to improve the electrical characteristics of the bipolar transistor.

While not critical, preferably the bipolar transistor is subjected to an emitter drive-in step. This step may be preceded by forming an oxide cap to reduce evaporation of the doping of the emitter material. In removing the oxide cap, sidewall spacers may be left at the side walls of the emitter of the bipolar transistor and the gates of the CMOS transistors. The sidewall spacers may then be used to prevent bridging during a subsequent self-aligning silicide process.

An advantage of the present invention is that the method utilizes none of the processing steps employed in formation of the CMOS transistors, and yet requires only two additional masking steps to form the base/emitter structure. Conventional CMOS fabrication techniques provide CMOS transistors having electrical characteristics which are not adversely affected by subsequent processing steps performed below a predetermined value of doping intensity and below a defined product of time and temperature of a heat cycle. The base/emitter structure is formed within the defined parameters. Thus, it is possible to optimize the electrical characteristics of both the CMOS and bipolar transistors without adhering to a complex process.

BEST MODE FOR CARRYING OUT THE INVENTION

Figure 1:
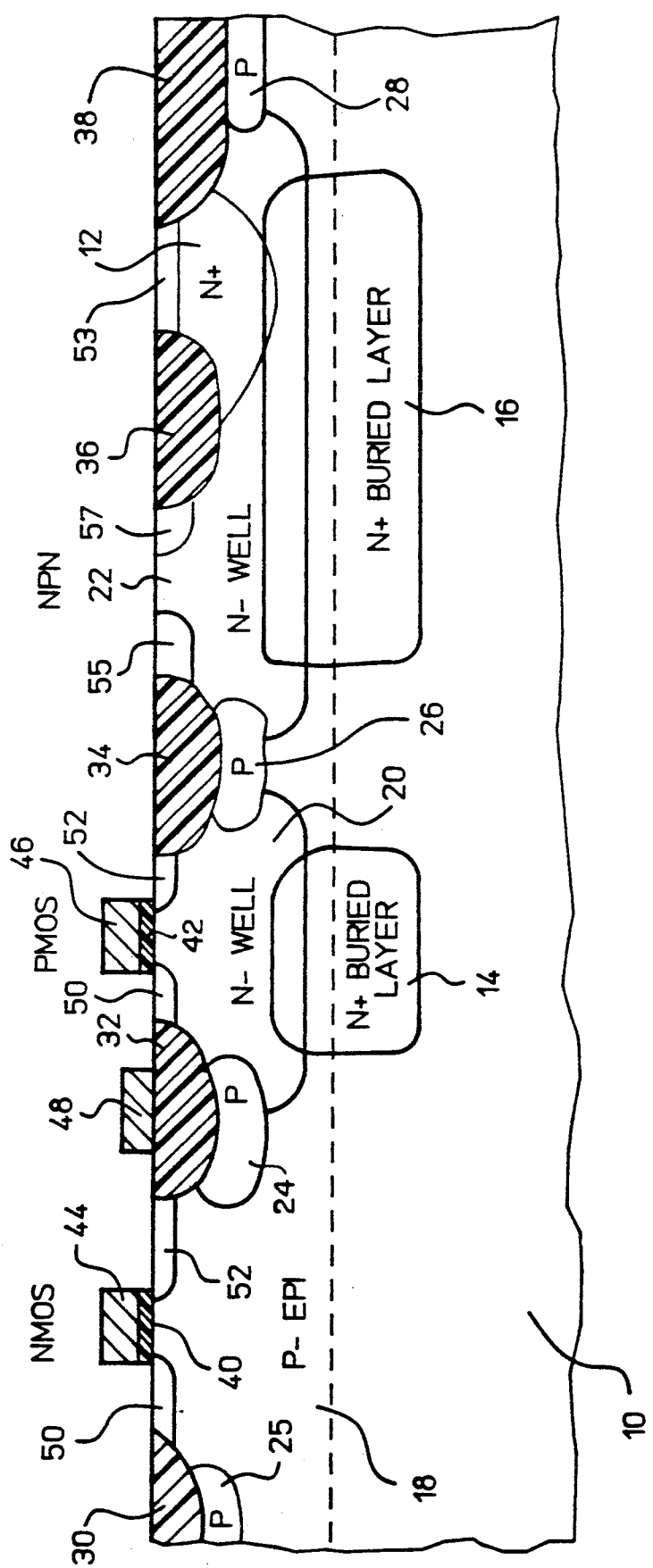
FIG. 1 is a side sectional view of a semiconductor substrate having NMOS and PMOS transistors and having base and collector regions for a bipolar transistor.

With reference to FIG. 1, a semiconductor substrate 10 is shown as including regions for an NMOS transistor, a PMOS transistor and a bipolar transistor. While the invention will be described as including fabrication of an NPN transistor, the process works equally well in fabrication of PNP transistors in a BiCMOS device.

In fabricating the NMOS and PMOS transistors, conventional CMOS processing is followed. The only necessary adjustments are in forming an N+ region 12 and N+ buried layers 14 and 16. One sequence of steps in forming the NMOS and PMOS transistors will be described below. However, the sequence is not critical.

In a first step, the N+ buried layers 14 and 16 are provided on the P− semiconductor substrate 10. An arsenic implant through a patterned dielectric layer may be used to form the buried layers 14 and 16.

The second step is a conventional step of forming a P− epitaxial layer 18. Unlike the first step, the epitaxial process does not require a mask. The third step is a masking step of forming shallow N− wells 20 and 22. The N− impurity is phosphorus and is implanted utilizing well known technology.

The next step is isolating the active regions of the transistors. P type junction isolation areas 24, 25, 26 and 28 are formed in the epitaxial layer 18 by an implant. Field oxide regions 30, 32, 34, 36 and 38 are formed in a conventional method using low pressure chemical vapor deposition, thermal oxidation, and masking techniques.

A sacrificial oxide layer, not shown, is used to clean up and protect the surface of the semiconductor substrate 10. A resist is deposited over the sacrificial layer and the resist is patterned to allow an implant of phosphorous to form the deep N+ collector 12. The deep N+ collector reduces the series resistance of the collector contact to the active bipolar transistor by lowering the resistance between the surface of the semiconductor substrate 10 and the N+ buried layer 16. All N− and P− channels are then formed. The sacrificial oxide is then removed.

The last step prior to forming the bipolar transistor is fabrication of the active regions of the CMOS transistors. This step includes growing a gate oxide 40 and 42 and low pressure chemical vapor depositing a first polysilicon 44 and 46. The gate oxide and first polysilicon layers are patterned to provide gates for the CMOS devices and to provide circuit paths 48. Alternatively, the circuit paths 48 may be provided by patterning a second polysilicon used for the bipolar transistor.

Sources 50 and drains 52 are conventionally formed using arsenic to implant N type impurities and $BF_2$ to implant P type impurities, preferably through a thin thermal screen oxide. For example, a P+ source/drain implant of $BF_2$ gas may be ion-implanted at an energy of 50 Kev and a dosage of $2 \times 10^{15}$ ions/cm$^2$. However, this is not critical. In addition, a collector contact area 53 is exposed to the N+ arsenic implant for the NMOS source/drain regions and base contact areas 55 and 57 are exposed to the P+ source/drain implant for the PMOS. Fabrication of the PMOS and NMOS active regions is thereby completed.

Figure 2:
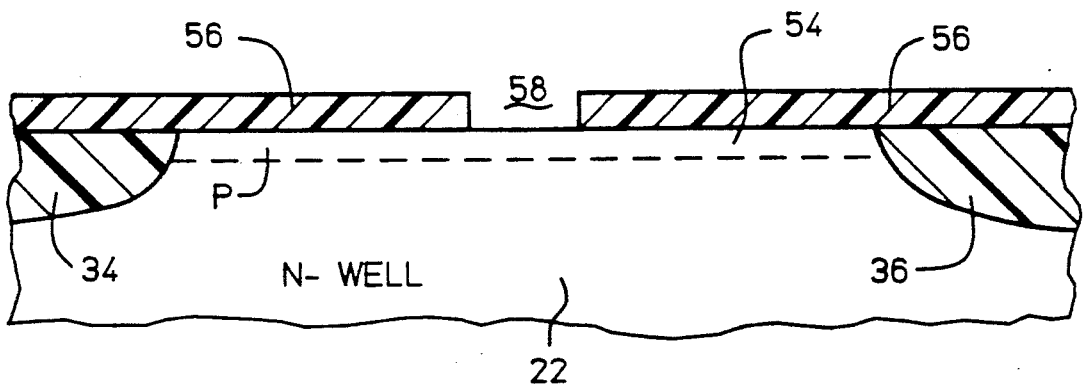
FIGS. 2-4 are cross sectional views of fabrication steps in providing a base/emitter structure on the base region of FIG. 1.

Formation of the base/emitter structure of the bipolar transistor is a process requiring only two masking steps. Self-aligning techniques are utilized to provide a high performance transistor. A first step is to provide a blanket base implant using $B^+$ or $BF_2^+$ ions. In the use of $BF_2^+$, the implant may be at an energy level of approximately 40 Kev and a concentration of $3 \times 10^{13}$ ions/cm$^2$. Because the blanket base implant is at a dosage that is orders of magnitude lower than the above-described implant which forms the source and drain regions 50 and 52, the blanket base implant does not adversely affect the electrical characteristics of the NMOS and PMOS transistors. The blanket base implant forms a P base layer 54 in the N− well 22, as shown in FIG. 2. The implant is a step which does not require use of a mask.

A low-temperature oxide, such as tetraethylorthosilane (TEOS) is deposited across the entirety of the structure of FIG. 1. The TEOS oxide is then subjected to a densifying process. The oxide layer 56 over the semiconductor substrate is shown in FIG. 2. The thickness of the oxide layer 56 may be approximately 2,500 angstroms, much thicker than the gate oxides of the CMOS transistors.

In forming and densifying the oxide layer 56, it is important that the processing does not affect the electrical characteristics of the fabricated CMOS transistors. In temperature cycling steps, the parameters of temperature and time each play an important role in ensuring that the CMOS transistors are not adversely affected. Thus, a higher temperature may reliably be used if the thermal cycle is a short one, while the temperature must remain relatively low for long thermal cycling steps. In densifying the oxide layer 56, the process may be performed at a temperature of approximately 850° C. for a short period of ten minutes.

A first masking step is then employed to pattern the oxide layer 56 to form an emitter window 58 shown in FIG. 2. The standard technique of depositing a photoresist, patterning the photoresist, etching the oxide layer 56 at window 58, and stripping the photoresist is utilized.

Figure 3:
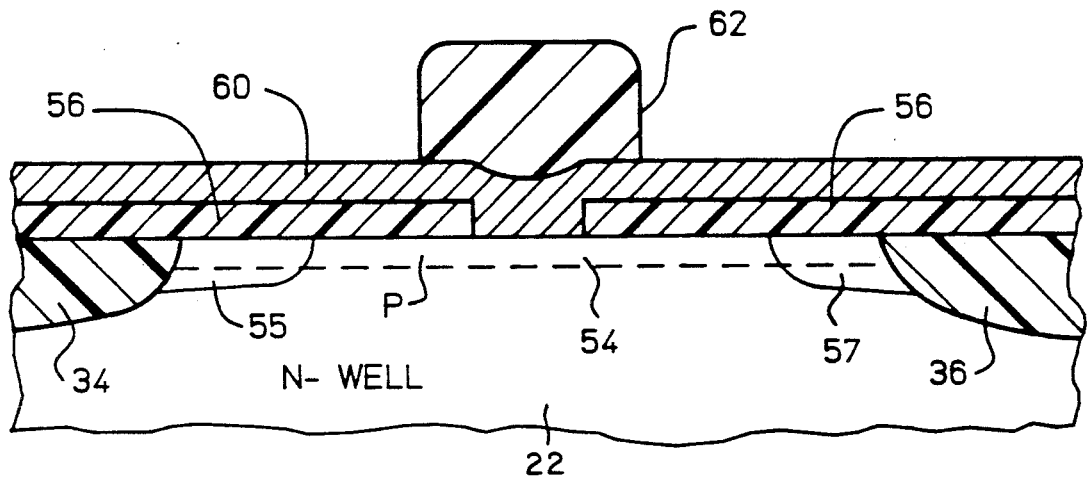

Referring now to FIG. 3, a second polysilicon layer 60 is deposited atop the oxide layer 56. The second polysilicon layer may have a thickness of approximately 2,500 angstroms, but this is not critical. The second polysilicon layer 60 enters the emitter window to contact the semiconductor substrate at the base layer 54. Optionally, the base impurity concentration may be augmented by driving additional B atoms from the second polysilicon layer. For example, this may be done by an implant of impurities using $BF_2^+$ ions at a concentration of approximately $2 \times 10^{15}$ ions/cm$^2$ and at an energy of about 40 Kev, whereafter an anneal of around 30 minutes at approximately 875° C. is employed. Implanting arsenic into layer 60 is performed at an energy of 100 Kev and a dosage intensity in the range of $1-2 \times 10^{16}$ ions/cm$^2$. Because the oxide layer 56 protects the CMOS transistors, masking is not necessary.

A photoresist layer 62 is deposited and patterned to provide the structure shown in FIG. 3. In a first etch, the portion of the second polysilicon layer 60 not covered by the photoresist layer 62 is removed to provide the emitter for the NPN transistor.

Figure 4:
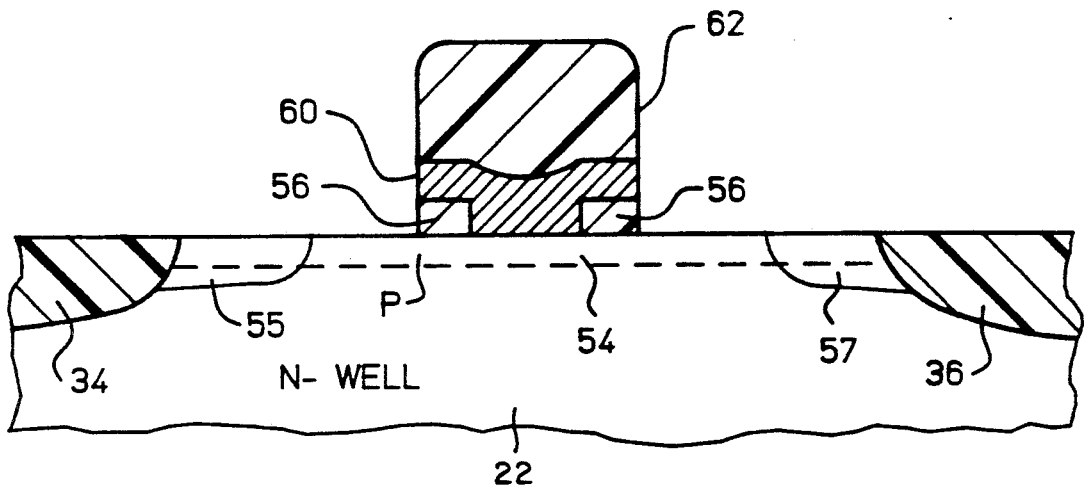

At this time, the photoresist layer 62 may be removed. However, this is not necessary. A second etch is employed to remove the portion of the oxide layer 56 not covered by the second polysilicon layer 60. The second polysilicon layer 60 acts as a mask. Thus, this step is a self-aligning step. The only masking steps employed in providing the structure of FIG. 4, therefore, are the step of patterning the oxide layer 56 to form an emitter window and the step of patterning the photoresist layer 62. Optionally, impurities may be implanted to form resistors at the base, source or drain regions of the CMOS and bipolar transistors.

Figure 5:
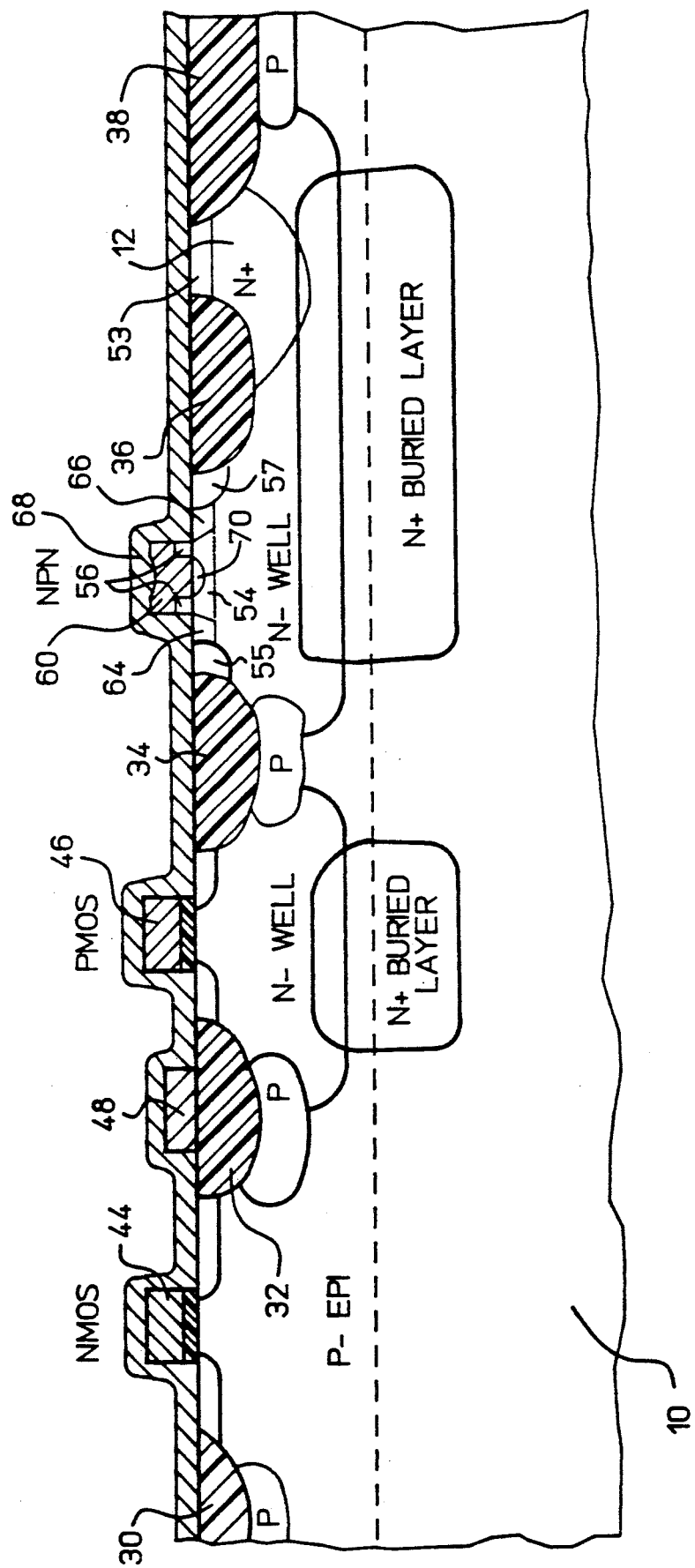
FIGS. 5 and 6 are side sectional views of fabrication steps taken after formation of the base/emitter structure in the base region of FIG. 1.

A blanket base-link implant of $B^+$ or $BF_2^+$ ions is added for the purpose of reducing base resistance within the base layer 54 beyond the emitter structure formed by layers 56 and 60. The base-link implant may also aid in reducing leakage due to silicide formation at the base layer 54. The silicide formation will be described below. The blanket base-link implant is at a concentration in the range of $10^{13}$–$10^{14}$ ions/cm$^2$. If the photoresist layer 62 has not already been etched away, it should be etched at this time. Referring to FIG. 5, base-link regions 64 and 66 are shown at opposed sides of the emitter structure formed by the second polysilicon layer 60 and the oxide layer 56. The base-link implant is a self-aligned implant, since the emitter structure limits the exposed area of the base layer.

Optionally, an emitter drive-in step may be added. If this step is to be performed, a cap 68 of oxide may be deposited to minimize variations in emitter junction depth that would result from evaporation of arsenic from the second polysilicon layer 60. Oxide, such as TEOS, is deposited at a thickness of approximately 1,000 angstroms. Standard emitter drive-in techniques may then be employed to form an emitter 70 that enters the semiconductor substrate 10 at the base layer 54.

Figure 6:
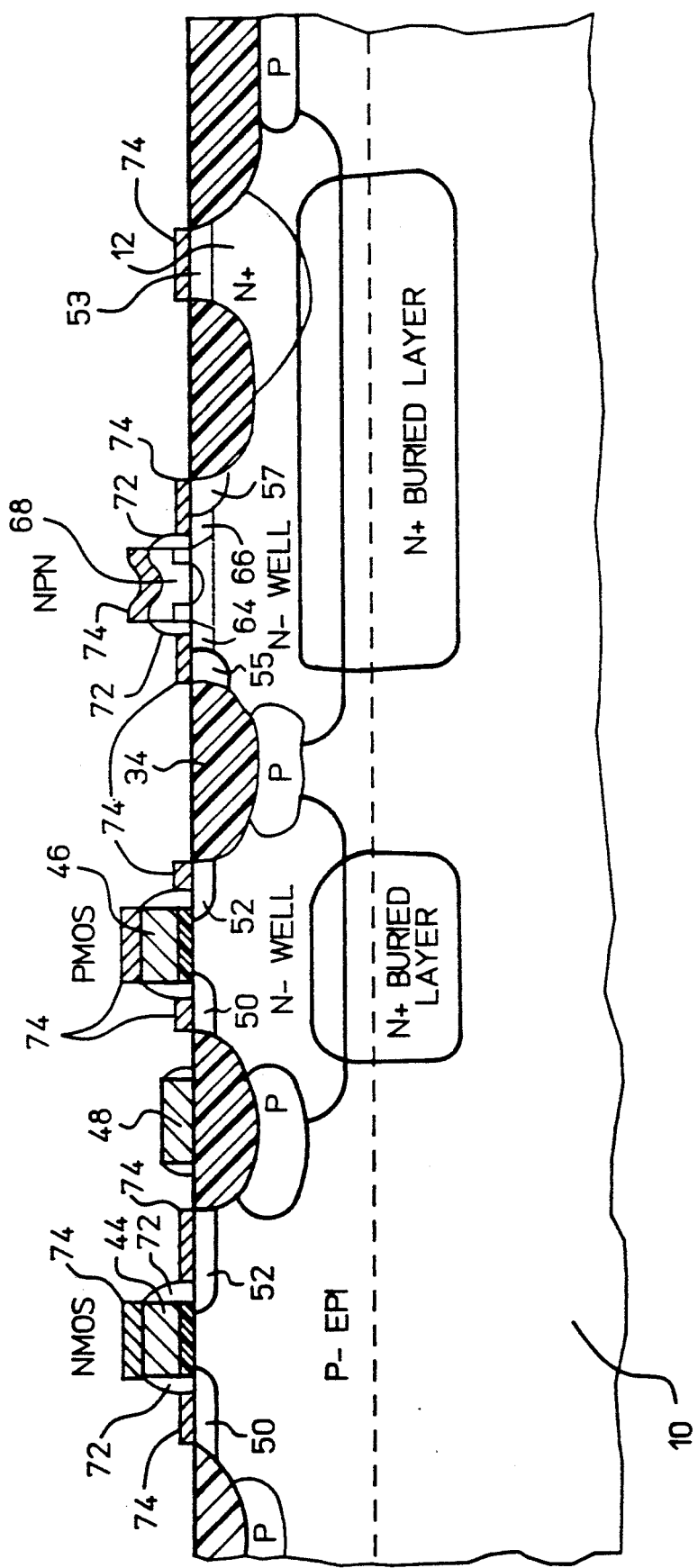

Following the emitter drive-in step, the oxide cap 68 is removed using reactive ion etching. Optionally, the oxide cap may be patterned to leave portions which prevent subsequent silicide formation on any second polysilicon resistor areas. Preferably, portions of the oxide cap are left intact to provide sidewall spacers 72 at the first and second layers of polysilicon, as shown in FIG. 6. The sidewall spacers 72 are used to prevent silicide "bridging" between the second polysilicon layer 60 and a base-link region or between a gate 44 and 46 and a source/drain region 50 and 52. Preferably, a layer of silicide 74 is provided using self-aligning silicide, i.e. salicide, techniques of depositing a refractory metal, reacting the refractory metal with silicon and polysilicon to form silicide, and removing unreacted metal.

We claim:

1. A method of fabricating a base/emitter structure of a bipolar transistor for a BiCMOS device using only two masking steps, said method comprising,
    providing a semiconductor substrate having PMOS and NMOS transistors and having a base region for forming a bipolar transistor,
    forming an insulating layer on said semiconductor substrate,
    utilizing a first mask to pattern a window in said insulating layer at said base region while leaving said PMOS and NMOS transistors covered by said insulating layer,
    forming a conductive emitter layer on said insulating layer and into said window,
    utilizing a second mask to remove portions of said emitter layer, leaving said emitter layer in said window and on an area of said insulating layer adjacent to said window, and
    utilizing said emitter layer adjacent to said window in a self-aligning manner to remove portions of said insulating layer and to leave that portion of said insulating layer below said emitter layer,
    thereby fabricating an emitter having aligned emitter layer and insulating layer walls by utilizing only two masking steps of forming said window and patterning said emitter layer.

2. The method of claim 1 further comprising the step of implanting impurities into said base region prior to said forming of said insulating layer, said implanting being performed in the absence of a masking step.

3. The method of claim 2 wherein said steps of implanting said impurities, forming said insulating layer, and forming said emitter layer are steps performed across the base region and said PMOS and NMOS transistors, said step of implanting said impurities being at a doping level substantially below doping levels in forming surface exposed regions of said PMOS and NMOS transistors.

4. The method of claim 1 wherein said step of utilizing said second mask is a step of patterning a photoresist material atop said emitter layer and etching said emitter layer.

5. The method of claim 1 further comprising the step of providing a base-link by implanting an impurity in said base region adjacent to said emitter, said step of implanting being performed using said emitter in a self-aligning manner, with an absence of masking.

6. The method of claim 5 further comprising the step of providing self-aligning silicide processing after formation of said emitter, said self-aligning silicide processing including forming silicide at said base-link, thereby reducing resistance at said base region.

7. A method of fabricating a base/emitter structure of a bipolar transistor on the same substrate as CMOS transistors comprising,
    forming isolated NMOS, PMOS and bipolar device regions in a semiconductor substrate, said bipolar device region having a base having a first horizontal surface area,
    forming an NMOS transistor in said NMOS device region and a PMOS transistor in said PMOS device region,
    introducing a first impurity in said base of said bipolar device region,
    forming an insulating layer on said bipolar device region and said NMOS and PMOS transistors,
    patterning said insulating layer to expose a surface portion of said base, said NMOS and PMOS transistors remaining covered by said insulating layer,
    depositing a conductive layer on said patterned insulating layer and on said exposed surface portion,
    removing a portion of said conductive layer to leave an emitter layer having a maximum horizontal area less than said first surface area,
    removing a portion of said insulating layer using said emitter layer as a mask in a manner to leave an emitter having vertical walls defined by said insulating and emitter layers, and
    introducing a base-link impurity into said base using said emitter as a mask to affect base conductivity about said emitter.

8. The method of claim 7 wherein said step of forming said NMOS and PMOS devices includes implanting impurities into said semiconductor substrate at relatively high dosage levels to form sources and drains, said step of introducing said first impurity in said base being a step of providing a blanket implantation across said NMOS, PMOS and bipolar regions at a dosage level sufficiently less than said relatively high dosage levels so as not to adversely affect performance of said NMOS and PMOS devices.

9. The method of claim 8 wherein said relatively high dosage levels exceed the dosage level of said blanket implantations by more than an order of magnitude.

10. The method of claim 7 further comprising providing an emitter drive-in step to said emitter.

11. The method of claim 7 wherein said step of forming an insulating layer is a step of depositing a low-temperature oxide layer.

12. A method of fabricating a BiCMOS device comprising, providing a semiconductor substrate, isolating PMOS, NMOS and base regions on said semiconductor substrate, forming MOS transistors in said PMOS and NMOS regions using techniques by which said MOS transistors have electrical characteristics which are not adversely affected by subsequent processing steps performed below a defined value of doping intensity and below a defined product of time and temperature of a heat cycle, said forming MOS transistors including depositing a gate layer, blanket implanting a first impurity across said PMOS, NMOS and base regions, said blanket implanting being at a doping intensity below said defined value of doping intensity, in a manner below said defined product of time and temperature, forming an insulating layer across said PMOS, NMOS and base regions, forming a window in said insulating layer to expose a portion of said base region, depositing emitter material atop said insulating layer and into said window, removing a portion of said emitter material to leave an emitter layer about said window, said emitter layer extending into said window, and in a self-aligning manner, utilizing said emitter layer as a mask in removing the portion of said insulating layer not covered by said emitter layer.

13. The method of claim 12 further comprising the step of utilizing said emitter layer and said conductive layer below said emitter layer as a mask and to provide a second blanket implant, said second blanket implant providing a base-link and being at a dosage intensity below said defined value of dosage intensity.

14. The method of claim 12 further comprising forming doped base contact and collector contact areas simultaneously with doping source and drain regions for said MOS transistors.

* * * * *